US009719697B2

(12) United States Patent
Ren et al.

(10) Patent No.: US 9,719,697 B2
(45) Date of Patent: Aug. 1, 2017

(54) GRADIENT SINO ANTI-REFLECTIVE LAYERS IN SOLAR SELECTIVE COATINGS (71) Applicant: University of Houston System, Houston, TX (US)

(72) Inventors: Zhifeng Ren, Houston, TX (US); Feng Cao, Houston, TX (US); Tianyi Sun, Waltham, MA (US); Gang Chen, Cambridge, MA (US)

(73) Assignees: UNIVERSITY OF HOUSTON SYSTEM, Houston, TX (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 100 days.

(21) Appl. No.: 14/297,716

(22) Filed: Jun. 6, 2014

(65) Prior Publication Data
US 2015/0015960 A1    Jan. 15, 2015

Related U.S. Application Data (60) Provisional application No. 61/837,258, filed on Jun. 20, 2013.

(51) Int. Cl.
*F24J 2/48*    (2006.01)
*C23C 14/02*    (2006.01)
(Continued)

(52) U.S. Cl.
CPC ............. *F24J 2/485* (2013.01); *C23C 14/027* (2013.01); *C23C 14/0688* (2013.01);
(Continued)

(58) Field of Classification Search
CPC ... G02B 5/003; G02B 1/11–1/118; F24J 2/48; F24J 2/481; F24J 2/484; F24J 2/485;
(Continued)

(56) References Cited

U.S. PATENT DOCUMENTS 4,582,764 A * 4/1986 Allerd .................... F24J 2/4652
126/908
6,235,456 B1 * 5/2001 Ibok ....................... G03F 7/091
257/437
(Continued)

FOREIGN PATENT DOCUMENTS

EP        0833956 B1    11/2005
WO    2012/172505 A1    12/2012

OTHER PUBLICATIONS

Fan et al., "Selective black absorbers using rf-sputter Cr2O3/Cr cermet films," Applied Physics Letters, vol. 30, No. 10, May 15, 1977, pp. 511-513.*
(Continued)

*Primary Examiner* — Stephone B Allen
*Assistant Examiner* — Adam W Booher
(74) *Attorney, Agent, or Firm* — Conley Rose, P.C.

(57) ABSTRACT

A solar selective coating includes a substrate, a cermet layer having nanoparticles therein deposited on the substrate, and an anti-reflection layer deposited on the cermet layer. The cermet layer and the anti-reflection layer may each be formed of intermediate layers. A method for constructing a solar-selective coating is disclosed and includes preparing a substrate, depositing a cermet layer on the substrate, and depositing an anti-reflection layer on the cermet layer.

21 Claims, 4 Drawing Sheets (51) Int. Cl.
   *C23C 14/06* (2006.01)
   *C23C 28/00* (2006.01)
   *F24J 2/46* (2006.01)

(52) U.S. Cl.
   CPC .......... *C23C 28/322* (2013.01); *C23C 28/324* (2013.01); *C23C 28/325* (2013.01); *C23C 28/34* (2013.01); *C23C 28/36* (2013.01); *F24J 2/4652* (2013.01); *Y02E 10/40* (2013.01)

(58) Field of Classification Search
   CPC ........ F24J 2/487; F24J 2/4652; C23C 14/027; C23C 14/0688; C23C 28/322; C23C 28/324; C23C 28/325; C23C 28/34; C23C 28/36; Y02E 10/40–10/47
   USPC .................. 359/350, 361, 601, 614, 885; 126/676–677
   See application file for complete search history.

(56) References Cited

U.S. PATENT DOCUMENTS

| | | |
|---|---|---|
| 2010/0035034 A1 | 2/2010 | Yin |
| 2010/0035081 A1 | 2/2010 | Clasen et al. |
| 2010/0258111 A1* | 10/2010 | Shah ...................... C23C 26/00 126/635 |
| 2010/0313875 A1 | 12/2010 | Kennedy |

OTHER PUBLICATIONS

Graf et al., Development of large area sputtered solar absorber coatings, Journal of Non-Crystalline Solids, 218, 1997, pp. 380-387.*

PCT/US2014/041209 International Search Report and Written Opinion dated Oct. 29, 2014 (14 p.).

* cited by examiner

GRADIENT SINO ANTI-REFLECTIVE LAYERS IN SOLAR SELECTIVE COATINGS

CROSS-REFERENCE TO RELATED APPLICATIONS

This application claims priority to U.S. Provisional Patent Application No. 61/837,258 filed on Jun. 20, 2013 and titled "Gradient SiNO Anti-Reflective Layers in Solar Selective Coatings" incorporated herein by reference in its entirety.

STATEMENT REGARDING FEDERALLY SPONSORED RESEARCH OR DEVELOPMENT

This work is supported by "Concentrated Solar Thermoelectric Power," funded by the U.S. Department of Energy under award number DE-EE0005806.

BACKGROUND

Field of the Disclosure

The disclosure relates generally solar-selective coatings. More specifically, the present disclosure relates to gradient SiNO anti-reflection layers in ceramic-metallic (cermet) solar selective coatings.

Background of the Technology

Generally, a solar selective coating is a kind of thermal collector configurable to harvest solar energy via a solar-thermal conversion route. Conventionally, it is understood that a selective absorber with a high solar absorptance ($\alpha$) in the wavelength range of about 0.3 µm to about 2.5 µm of the solar spectrum and a low thermal emittance ($\epsilon$) at the operational temperature in the wavelength range beyond 2.5 µm in the thermal region may cater to the requirements of enhanced photo-thermal conversion efficiency. Theoretically, an ideal solar absorber should have zero reflectance over solar spectrum region and zero thermal emittance.

Commercial investigation into solar absorber/spectrally selective coatings and various applications therefore has been conducted over the last 55 years. The investigations have identified and commercialized black chrome coatings for solar hot water applications. Black chrome may be considered as a successful commercial selective coating material and it has an absorptance ($\alpha$) of about 0.90 µm to about 0.95 µm and an emittance ($\epsilon$) of about 0.1 µm to about 0.2 µm. In most applications, the black chrome is electroplated onto an application.

However, the poor or high thermal emittance properties have restrained the widespread incorporation of black chrome into commercial products. Additionally, the environmental concerns and regulations associated with electroplating have provided a disincentive for further development of the black chrome coatings. Thus, solar selective coatings with high solar absorptance, low thermal emittance, and low reflectance are sought for commercial applications.

BRIEF SUMMARY OF THE DISCLOSURE

In one embodiment, a solar-selective coating comprises a substrate, at least one cermet layer having nanoparticles therein deposited on the substrate, and at least one anti-reflection layer deposited on the at least one cermet layer. The coating may further comprise a buffer layer disposed between the substrate layer and the at least on cermet layer. The cermet layer may comprise a gradient between the substrate and the at least one anti-reflection layer in some embodiments. The gradient may comprise a plurality of cermet layers. In certain embodiments, the anti-reflection layer comprises a gradient above the at least one cermet layer, and in some instances, the coating further comprises a plurality of anti-reflection layers. In some embodiments, the solar-selective coating comprises a solar absorptance ($\alpha$) of at least about 0.75, in the wavelength range of about 0.3 µm to about 2.5 µm, and in certain instances, the coating may include a thermal emittance of less than about 0.25 at about 82° C.

A method for constructing a solar-selective coating comprises, preparing a substrate, depositing at least one cermet layer on the substrate, and depositing at least one anti-reflection layer on the cermet layer. In some embodiments, preparing a substrate comprises cleaning at least one surface of the substrate and depositing a buffer layer on the cleaned surface. Depositing the at least one cermet layer on the substrate may comprise depositing a cermet gradient on the substrate, and in some instances, depositing a plurality of cermet layers. In some embodiments disclosed herein, depositing a cermet gradient comprises controlling at least one property of the deposition to form a gradient. Also, in some embodiments, depositing at least one anti-reflection layer on the substrate comprises depositing an anti-reflection gradient, and in instances, depositing a plurality of anti-reflection layers. In some embodiments, the depositing an ant-reflection gradient comprises controlling at least one property of the anti-reflection deposition to form a gradient.

Generally, the gradient SiNO coatings are prepared by the reactive sputtering and used as anti-reflection layers for Cr—CrNO (i.e. Cr nanoparticles inside CrNO) cermets based spectral selective coatings. The compositions of both Cr—CrNO and SiNO are facilely tuned by changing the gas flow of Ar, $N_2$ and $O_2$ during deposition, which correspondingly adjusts the optical parameters of the coatings and induces the different absorption in visible range. As disclosed herein, the optimized configuration of coatings, having three absorption layers and three anti-reflection layers, demonstrated a high absorptance of 0.935 and low emittance of 0.056 at 82° C. This coating can be considered as a spectral selective material for the solar-thermal collector applications.

Exemplary embodiments described herein comprise a combination of features and characteristics intended to address various shortcomings associated with certain prior compositions, devices, systems, and methods. The various features and characteristics described above, as well as others, will be readily apparent to those of ordinary skill in the art upon reading the following detailed description, and by referring to the accompanying drawings. It is to be understood that the conception and the specific embodiments disclosed may be readily utilized as a basis for modifying or designing other compositions, devices, systems, and methods for carrying out the same purposes as the exemplary embodiments disclosed herein. It is also to be understood that such equivalent constructions do not depart from the spirit and scope of the invention as set forth in the appended claims.

BRIEF DESCRIPTION OF THE DRAWINGS

For a detailed description of the exemplary embodiments of the invention described herein, reference will now be made to the accompanying drawings in which.

DETAILED DESCRIPTION OF THE DISCLOSED EMBODIMENTS

Overview

Generally, the solar absorptance ($\alpha$) and thermal emittance ($\epsilon$) of spectrally selective coatings may be calculated as shown in Equation 1 and Equation 2, respectively. In Equations 1 and 2, $\rho(\lambda, T)$ is the reflectance measured at certain wavelength and temperature, $S(\lambda)$ is the direct normal solar irradiance (AM 1.5), $B(\lambda, T)$ is the blackbody spectral radiation, and T is the temperature.

$$\alpha_s(T) = \frac{\int_{\lambda_{min}=0}^{\lambda_{max}=\infty} [[1-\rho(\lambda, T)]S(\lambda)]d\lambda}{\int_{\lambda_{min}=0}^{\lambda_{max}=\infty} S(\lambda)d\lambda} \quad (1)$$

$$\varepsilon_t(T) = \frac{\int_{\lambda_{min}=0}^{\lambda_{max}=\infty} [[1-\rho(\lambda, T)]B(\lambda, T)]d\lambda}{\int_{\lambda_{min}=0}^{\lambda_{max}=\infty} B(\lambda, T)d\lambda} \quad (2)$$

Described herein is a solar-selective coating that is configurable to operate as solar-thermal energy conversion system to be used, for example, for solar hot water and flat-panel solar thermoelectric generator applications. The solar-selective coating comprises properties of high solar absorptance, low thermal emittance, and low reflectance. Generally, the solar-selective coating is configured as a layered thermoelectric material. More specifically, the solar-selective coating comprises a substrate having a gradient of graded Cr—CrNO cermet layers deposited thereon. Further, a gradient of SiNO anti-reflection layers is directly deposited on the aforementioned graded Cr—CrNO cermet layers. The performance and spectral selectivity of the coatings are configurable for specific applications by manipulating layer properties, including the thickness and number of layers, as well as by manipulating deposition conditions of a layer or layers.

Structure:

Generally, the structure of the solar selective coatings described herein comprises a substrate. The substrate comprises any electrically conductive material including metals, semiconductors, or superconductors, without limitation. There is at least one layer of a ceramic-metallic material, hereinafter "cermet," deposited on at least one surface of the substrate. There is at least one layer of an anti-reflective material deposited on the surface of the cermet. Thus, in exemplary configurations, the solar-selective coatings of the present disclosure may be considered to comprise a plurality of layers deposited on a substrate.

Figure 1:
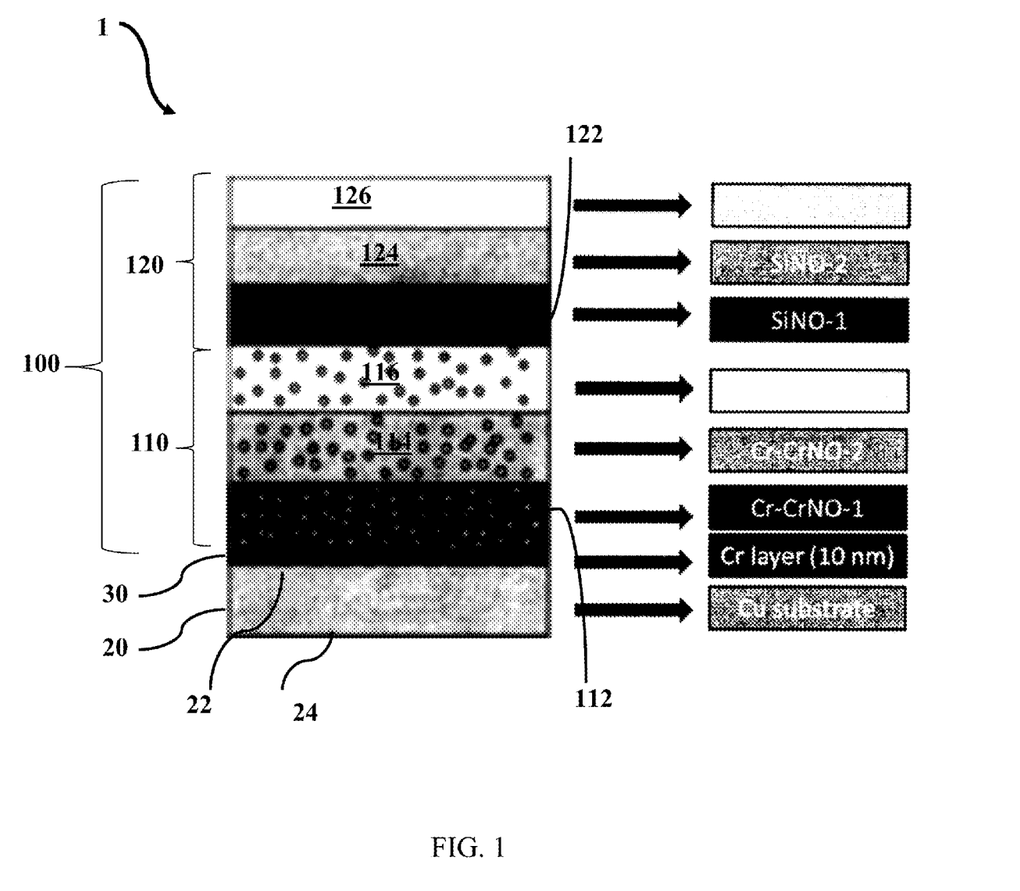
FIG. 1 illustrates a cross-section schematic of a solar-selective coating according to various embodiments of the present disclosure.

Referring now to FIG. 1, there is illustrated an exemplary device 1, comprising a solar-selective coating 100. The solar-selective coating 100 is deposited on a substrate 20. In some configurations, the substrate comprises a buffer layer 30. The solar-selective coating 100 comprises at least one cermet layer 110 and at least one anti-reflective layer 120. In configurations, the cermet layer 110 comprises a gradient, wherein a property of the cermet layer 110 changes across its thickness. In some configurations, and as shown in FIG. 1, the cermet layer 110 comprises intermediate cermet layers, including a first cermet layer 112, second cermet layer 114, third cermet layer 116 and any number of additional cermet layers. Likewise in configurations, the anti-reflective layer 120 comprises a gradient, wherein a property of the anti-reflective layer 120 changes across its thickness. Further, in some configurations, and as shown in FIG. 1, the anti-reflective layer 120 comprises intermediate anti-reflective layers, including a first 122, second 124, third 126 anti-reflective layers, and any number of additional anti-reflective layers.

Generally, the solar-selective coating 100 is configured to have a high solar absorptance ($\alpha$) in the wavelength range of about 0.3 µm to about 2.5 µm of the solar spectrum and a low thermal emittance ($\epsilon$) at the operational temperature in the wavelength range beyond 2.5 µm in the thermal region. In instances, the present solar selective coating 100 is configured to have a solar absorptance ($\alpha$) of at least about 0.75, alternatively at least about 0.80, and in certain configurations an absorptance of at least about 0.90. In exemplary configurations, the solar selective coating as a solar absorptance of at least about 0.93. Likewise, the present solar selective coating is configured to have a thermal emittance of less than about 0.25 at about 82° C., alternatively less than about 0.15, and in certain configurations a thermal emittance of less than about 0.10. In exemplary configurations, the thermal emittance at about 82° C. is less than about 0.06.

Still referring to FIG. 1, the substrate 20 comprises a conductive material. Generally, the substrate 20 comprise an electrically, a thermally, or a thermoelectrically conductive material. The substrate 20 comprises a metal, semi-conductor, or superconductor, without limitation. In configurations, the substrate 20 comprises a planar configuration having opposite sides, for example a top side 22 and a bottom side 24. The substrate 20 comprises a transition metal, such as but not limited to, copper (Cu), silver (Ag), gold (Au), nickel (Ni), palladium (Pd), platinum (Pt), or alloys and combinations thereof. In exemplary configurations, the substrate 20 is copper (Cu). Further, the substrate 20 may be treated, polished, etched, or otherwise processed prior to incorporation into a device 1. Device 1 may be a solar-thermal collector panel, in exemplary instances.

In certain configurations, a buffer layer 30 is deposited on at least one side of the substrate 20, for example on the top side 22. Generally, the buffer layer 30 comprises a thickness of between about 1 nm and about 50 nm; alternatively between about 1 nm and about 20 nm; and in exemplary configurations, the buffer layer 30 is about 10 nm thick. Without limitation, the buffer layer 30 comprises a metal. Further, the buffer layer 30 comprises an electrically, a thermally, or a thermoelectrically conductive metal. In instances, the buffer layer 30 comprises a transition metal, such as but not limited to a metal found in the periodic groups VB, VIB, VIIB, VIII, IB, IIB, or alloys and combinations thereof. In certain configurations, the buffer layer 30 comprises ceramic metals, alloys, and combinations thereof. In an exemplary configuration, the buffer layer 30 comprises chromium (Cr).

Generally, the cermet layer 110 is deposited on at least one side of the substrate 20, for example the top side. In some instances, the cermet layer 110 is deposited on the buffer layer 30. The cermet layer 110 and each of the intermediate cermet layers, including the first 112, second 114, and third cermet layers 116, comprise a thickness of between about 1 nm and about 50 nm; alternatively between about 1 nm and about 20 nm; and in exemplary configurations, each intermediate cermet layer 112, 114, 116 is about 10 nm thick. Without limitation, the cermet layer 110 comprises at least one metallic element chosen from the transition metals found in the periodic groups VIB, VIIB, VIII, or alloys and combinations thereof. The at least one metallic element comprises nanoparticles that are included in the cermet layer. Further, the metals of the cermet layers 110 act as binders for the nanoparticles as well as nitrides (N), oxides (O), nitric-oxides (NO), carbides (C), borides (B), or alloys and combinations thereof. In an exemplary configuration, the cermet layers 110 comprise at least one layer of chromium nanoparticles in chromium nitric oxide (Cr—CrNO). In certain configurations, the cermet layers 110 may be a single layer, having different properties at different thicknesses.

As shown in FIG. 1, the cermet layer 110 may comprise intermediate cermet layers, including a first layer 112, a second layer 114, a third layer 116, or additional layers without limitation. In the example of FIG. 1, the first layer 112 is deposited on the substrate 20 or the buffer first. Each subsequent layer, for example the second layer 114 and the third layer 116, etc., is deposited on the preceding layer. Further, in this exemplary embodiment, each of the intermediate cermet layers 112, 114, 116 comprises a different composition or possesses a different ratio of the metal to ceramic content as compared to other intermediate cermet layers of cermet layer 110. For example, the first layer 112 comprises denser or higher metal content relative to its ceramic content. Subsequent layers in this embodiment, such as the second layer 114, the third layer 116, and additional layers are have different ratios of the metal to ceramic content relative to the first layer 112. Thus, continuing with this specific embodiment: the ratio of the metal to ceramic content in the first layer 112 is greater than the ratio of the metal to ceramic content in the second layer 114; the ratio of the metal to ceramic content in the second layer 114 is greater than the ratio of the metal to ceramic content in the third layer 116; and still moving in the direction away from substrate 20, each subsequent additional cermet layer has a lower metal to ceramic content than the preceding layer. Without limitation by any particular theory, the lower ratio of metal to ceramic content in each successive intermediate cermet layer 112, 114, 116 and so on, forming cermet layer 110 creates a gradient within cermet layer 110, for example a gradient of the metal to ceramic content. In exemplary configurations, and considering the properties of cermet layer 110 as moving from anti-reflective layer 120 toward substrate 20, the metal to ceramic content gradient of the cermet layer 110 increases with each successive cermet layer making up the cermet layer 110. In alternative arrangements, intermediate cermet layers 112, 114, 116 can be selected such that, as moving from anti-reflective layer 120 toward substrate 20, the metal to ceramic content gradient of the cermet layer 110 decreases with each successive intermediate cermet layer making up the cermet layer 110. Further, in certain instances a gradient of the cermet layer 110 is formed by altering the deposition of a single cermet layer, and thereby causing the physical properties of the cermet layer 110 to differ at different locations within its thickness.

Generally, the anti-reflective layer 120 is deposited on at least one side of the substrate 20, for example the top side. In some instances, the anti-reflective layer 120 is deposited on the cermet layer 110. In exemplary configurations, and referring again to FIG. 1, the anti-reflective layer 120 is deposited on the outermost of the cermet layers 110, for example the third intermediate layer 116. The anti-reflective layer 120 and the intermediate anti-reflective layers including the first 122, second 124, and third 126 intermediate anti-reflective layer, each comprise a thickness of between about 1 nm and about 50 nm; alternatively between about 1 nm and about 20 nm; and in exemplary configurations, each intermediate anti-reflective layer 122, 124, 126 is about 10 nm thick. Without limitation, the anti-reflective layer 120 comprises at least one semi-metallic or metallic element chosen from the group consisting of boron (B), silicon (Si), germanium (Ge), arsenic (As), selenium (Se), antimony (Sb) and tellurium (Te), aluminum (Al), gallium (Ga), Indium (In), tin (Sn), thallium (Ti), lead (Pb), bismuth (Bi), and polonium (Po) or alloys and combinations thereof. Further, the semi-metals or metals of the anti-reflective layers 120 act as binders for nitrides (N), oxides (O), nitric-oxides (NO), carbides (C), borides (B), or alloys and combinations thereof. In an exemplary configuration, the anti-reflective layers 120 comprise at least one layer of silicon nitric oxide (SiNO). In certain configurations, the anti-reflective layers 120 may be a single layer, having different properties at different thicknesses.

As shown in FIG. 1, the anti-reflective layers 120 may comprise intermediate layers, for example, a first layer 122, a second layer 124, a third layer 126, or additional layers, without limitation. In the example of FIG. 1, the first intermediate layer 122 is deposited on the cermet layer 110. Each subsequent layer, for example the second layer 124 and the third layer 126, etc., are deposited on the preceding layer, thereafter. Further, each of the anti-reflective layers 122, 124, 126, comprises a different thickness, a different composition, and/or a different ratio of the semi-metallic or metallic elements to nitric oxide content therein as compared to the previously deposited anti-reflective layers making up anti-reflective layer 120. For example, the first layer 122 comprises denser or higher semi-metallic elements relative to the nitric oxide content, or vice versa. Subsequent intermediate layers, such as the second layer 124, the third layer 126, and additional layers have different ratios of the semi-metallic or metallic elements to nitric oxide content relative to the first layer 122. As described hereinabove, each successive anti-reflective layer has a lower ratio of the semi-metallic or metallic elements to nitric oxide content than the preceding layer. Without limitation by any particular theory, the difference in the ratios of semi-metallic or metallic elements to nitric oxide content in each successive anti-reflective layer 122, 124, 126, and so on, forming anti-reflective layer 120 creates a gradient within anti-reflective layer 120, for example a gradient of the ratio of semi-metallic or metallic elements to nitric oxide content. Further, in certain instances a gradient of the anti-reflective layer 120 is formed by altering the deposition of a single anti-reflective layer, and thereby causing the physical properties of the anti-reflective layer 120 to differ at different locations within its thickness.

Figure 2:
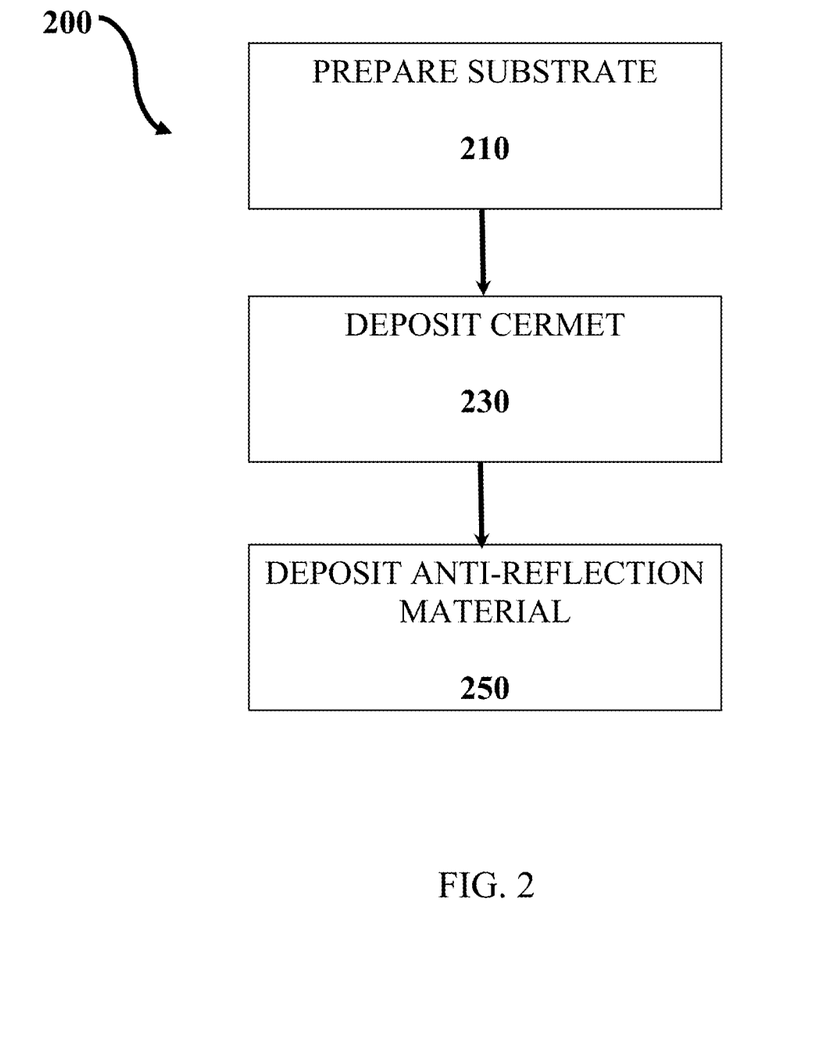
FIG. 2 illustrates a schematic of a method for constructing a solar-selective coating according to various embodiments of the present disclosure.

Construction:

Referring now to FIG. 2 there is illustrated a method 200 for constructing a solar-selective coating. Generally, the method 200 comprises preparing 210 a substrate, depositing 230 a ceramic-metallic, hereinafter a cermet, on the substrate, and depositing 250 anti-reflection materials on the cermet. In certain configurations of the method 200, the steps of depositing 230 a cermet and depositing 250 anti-reflection materials comprise depositing multiple layers of the cermet and anti-reflection materials. Further, depositing 230 a cermet comprises forming a gradient of cermet layers. Likewise, depositing 250 anti-reflection layers comprises forming a gradient of anti-reflection layers.

Figure 3:
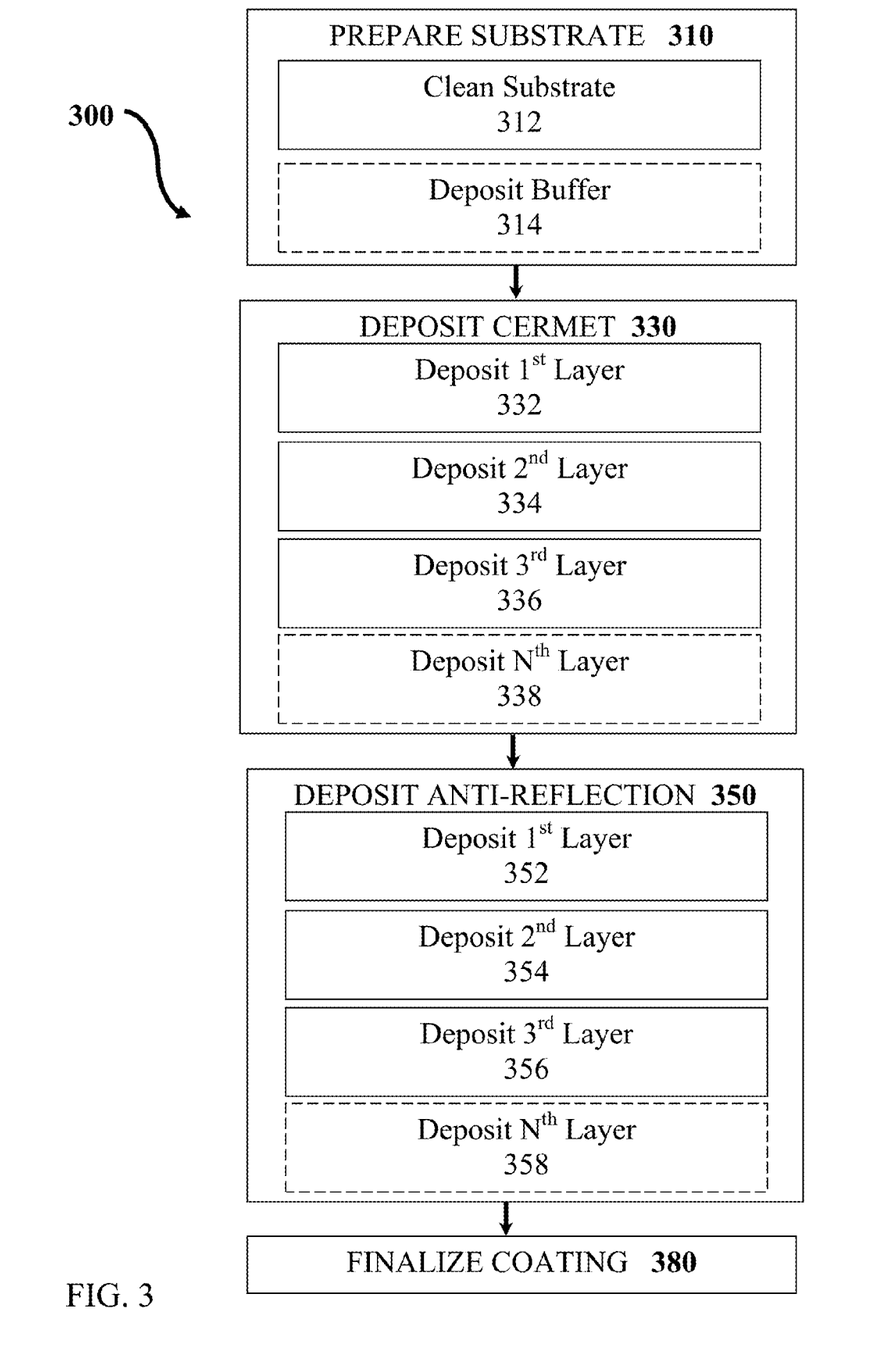
FIG. 3 illustrates a schematic of a method for constructing a solar-selective coating according to various embodiments of the present disclosure.

Referring now to FIG. 3 there is illustrated an exemplary method 300 for constructing a solar-selective coating. Generally, the method 300 is related to method 200 illustrated in FIG. 2 and described hereinabove. The method 300 comprises the steps of preparing 310 a substrate, depositing 330 a cermet, depositing 350 an anti-reflection material, and finalizing 380 the coating. More specifically, preparing 310 a substrate comprises the steps of cleaning 312 a substrate and optionally, depositing 314 a buffer layer. Also, depositing 330 a cermet comprises the steps of depositing 332 a first layer, depositing 334 a second layer, depositing 336 a third layer, and optionally depositing 338 an $N^{th}$ layer wherein the first, second, third, and $N^{th}$ layers are intermediate layers. Further, depositing 250 an anti-reflection material comprises the steps of depositing 352 a first layer, depositing 354 a second layer, depositing 356 a third layer, and depositing 358 an $N^{th}$ layer, wherein the first, second, third, and $N^{th}$ layers are intermediate layers. Without limitation by theory, it is understood wherein that an "Nth layer" is any positive integer greater than zero (0). Finalizing 380 the coating comprises any or all of protecting the coating, installing the coated substrate in a device, and any other steps to electrically, thermally, or thermo-electrically couple the substrate to another device or system.

Still referring to FIG. 3, preparing the substrate 310 comprises cleaning 312 a substrate and optionally, depositing 314 a buffer layer. Cleaning 312 a substrate comprises cleaning a metal, semi-metal, or metallic substrate. In instances, cleaning 312 a substrate comprises treating at least one surface of the substrate in preparation for a deposition of another material thereon. Further, cleaning 312 a substrate comprises polishing or etching at least one surface of the substrate. In certain instances, cleaning 312 a substrate comprises using a noble gas, such as but not limited to argon (Ar) to remove oxides from at least one surface of the substrate. Also, cleaning 312 the substrate comprises positioning the substrate in a low pressure chamber, for example a chemical-vapor deposition (CVD) chamber or a chamber for sputter coating. In instances, the pressure of the chamber during cleaning may be below about 0.01 mTorr, and alternatively, below about 0.001 mTorr.

Optionally, preparing 310 the substrate further comprises depositing 314 a buffer layer. In some instances, depositing 314 a buffer layer comprises depositing at least one layer of a metal, semi-metal, or metallic substance on the cleaned surface of the substrate. Depositing 314 a buffer layer comprises CVD or sputter deposition of the at least one layer. Generally, the buffer layer is deposited in a high purity form. For example, in the application of a sputter coating method using chromium, the sputtering target is 99.95% pure.

As illustrated in FIG. 3, depositing 330 a cermet comprises the steps of depositing 332 a first layer, depositing 334 a second layer, depositing 336 a third layer, and optionally depositing 338 an $N^{th}$ layer. Without limitation by theory, it is understood wherein that an "$N^{th}$ layer" is any positive integer greater than zero (0), and that the first, second, third, and $N^{th}$ layers may be considered intermediate layers. Generally, the properties of the first layer, second layer, third layer, etc., maybe altered or controlled during deposition. Exemplary properties of the cermet layers comprise the ratio of metals to ceramic content, the density of the layer, and the thickness of the layer, without limitation. In exemplary methods, the purity of a sputtering target alters the properties of each respective layer. Still further, altering the pressure of the deposition chamber alters the properties of each respective layer. Likewise, altering the ratio of inert gases in the chamber alters the properties of each respective layer. In certain exemplary methods, altering the gas ratio controls the properties of each respective layer. In some configurations, the ratio of inert gases comprising noble gases and nitrogen (N), with the reactive gas oxygen (O) provides a means to control the density of each respective layer. Still further, in sputtering applications, the distance of the substrate with respect to the sputtering targets may alter the properties of each respective layer. Still further, altering the above described conditions of deposition over time may form a gradient within each layer. Generally, depositing 332 the first layer comprises depositing the most robust, thickest, densest, or layer having the highest ratio of metal to ceramic materials. Likewise, the depositing 336 the third layer or in the alternative, depositing 338 the Nth layer, comprises depositing the least robust, thinnest, lease dense, or the layer having the lowest ratio of metal to ceramic material content. In instances, each successive layer is less dense or thinner than the previous one in order to form a gradient of the cermet layers when depositing 330 the cermet.

As shown in FIG. 3, depositing 250 an anti-reflection material comprises the steps of depositing 352 a first layer, depositing 354 a second layer, depositing 356 a third layer, and depositing 358 an $N^{th}$ layer. Without limitation by theory, it is understood wherein that an "$N^{th}$ layer" is any positive integer greater than zero (0) and the first, second, third, and $N^{th}$ layers may be considered intermediate layers. Generally, the properties of the first layer, second layer, third layer, etc., maybe altered or controlled during deposition. Exemplary properties of the anti-reflection layers comprise the ratio of semi-metallic or metallic elements to nitric oxide content, the density of the layer, and the thickness of the layer, without limitation. In exemplary methods, the purity of a sputtering target alters the properties of each respective layer. Also, in sputtering applications, altering the direct current (DC) and the radio frequency (RF) power of the reactive magnetron alters the properties of each respective layer. Still further, altering the pressure of the deposition chamber alters the properties of each respective layer. Likewise, altering the ratio of inert gases in the chamber alters the properties of each respective layer. In certain exemplary methods, altering the gas ratio controls the properties of each respective layer. In some configurations, the ratio of inert gases comprising noble gases and nitrogen (N), with the reactive gas oxygen (O) provides a means to control the density of each respective layer. Still further, in sputtering applications, the distance of the substrate with respect to the sputtering targets may alter the properties of each respective layer. Still further, altering the above described conditions of deposition over time may form a gradient within each layer. Generally, depositing 332 the first layer comprises depositing the most robust, thickest, densest, or the layer having the highest ratio of metal to ceramic materials. Likewise, the depositing 336 the third layer or in the alternative, depositing 338 the Nth layer, comprises depositing the least robust, thinnest, lease dense, or the layer having the lowest ratio of semi-metallic or metallic elements material content. In instances, each successive anti-reflection layer is less dense or thinner than the previous in order to form a gradient during depositing 350 the anti-reflection layers.

To further illustrate various illustrative embodiments of the present invention, the following examples are provided.

EXAMPLES

The solar selective coating, a kind of thermal collector, can harvest solar energy via solar thermal conversion route. A selective absorber with a high solar absorptance ($\alpha$) in the wavelength range of 0.3 to 2.5 μm and a low thermal emittance (E) at the operational temperature in the wavelength range beyond 2.5 μm may cater to the requirements of enhanced photo-thermal conversion efficiency. As a successful selective coating material, black chrome synthesized with an electroplating method has been utilized for more than 20 years for solar hot water applications, which has the absorptance of 0.90-0.95 and emittance of 0.1-0.2. However, the environmental concerns associated with electroplating and high thermal emittance have restrained its wide applications. In this experiment, graded Cr—CrNO cermets and SiNO anti-reflection layers were directly deposited using reactive magnetron sputtering with a direct current (DC) power and a radio frequency (RF) power, respectively.

The solar spectral selective coatings were deposited on copper substrate, but can be any substrate, using a commercial ATC ORION SPUETTERING (AJA international, Inc.). Prior to deposition, the chamber was pumped down to lower than 1×10−6 Torr. The prepared copper substrate was further cleaned by Ar ion to remove oxides layer from copper substrate. The chromium (99.95% purity) and silicon (99.99% purity) targets were used to deposit CrNO and SiNO layer. The total sputtering gas pressure was 3 mTorr comprising of Ar, $N_2$, and $O_2$ with different ratios. The sublayers of CrNO or SiNO were achieved through adjusting the gas ratio, especially the ratio of $N_2/O_2$. The thickness of as-prepared film was measured using Alfa-step 200 profilometer, and the optical reflectance was characterized using a FT-IR system equipped with different light sources and detectors.

The film configuration of solar selective coatings was designed as shown in FIG. 1 which comprises of one Cr layer in the bottom as the adhesion layer between substrate and the top layers, three Cr—CrNO layers in the middle, and three SiNO layers on the top. The substrate was polished Cu sheet as IR reflector. The three Cr—CrNO layers with different metal content acted as absorption layer. And on the top, the three SiNO layers with different optical parameters were used as anti-reflection layers, which were transparent ceramic material and could enhance the solar absorption.

Figure 4:
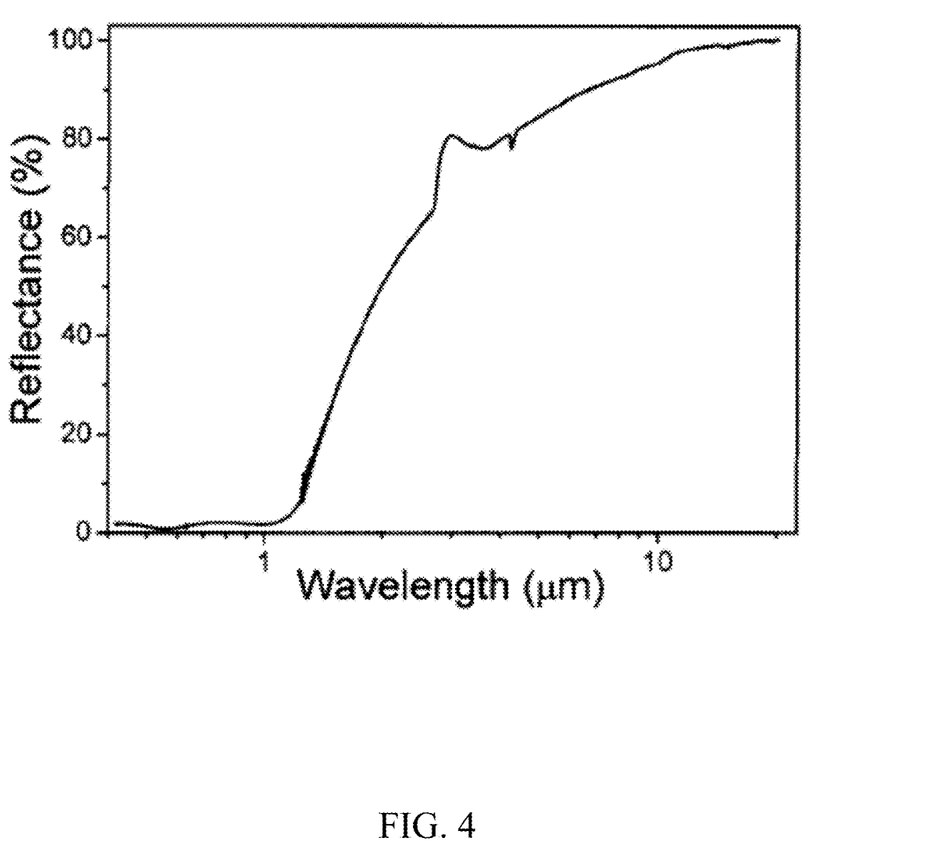
FIG. 4 illustrates a graphical analysis of a solar reflective spectrum of a solar-selective coating according to various embodiments of the present disclosure.

To evaluate the solar selectivity of solar selective coatings, we measured the reflectance spectrum as shown in FIG. 4. The very low reflectance was obtained in the wavelength range of less than 1 μm. And the reflectance was almost 100% in the high wavelength. All of those are beneficial for achieving high efficiency of solar thermal conversion. Based on the reflectance spectrum, the solar absorptance and thermal emittance can be calculated. The high absorptance of 0.935 and low emittance of 0.056 at 82° C. were achieved in optimized solar selective coatings. The emittance has a large enhancement compared with the coatings prepared by electroplating. The high solar selectivity of selective surface may be resulted from the intrinsic properties of Cr—CrNO cermet layers and gradient SiNO layers, and the interference among different layers. We can further optimize the solar selectivity of coatings through adjusting the thickness of each layer, optimizing the metal content in cermets and changing the composition of anti-reflection layers.

A solar selective surface with Cr—CrNO cermet and gradient SiNO anti-reflection layer was prepared using a commercial route, reactive sputtering. The compositions of both Cr—CrNO and SiNO can be facilely tuned by changing the gas flow of Ar, $N_2$, and $O_2$ in the process of deposition, which can correspondingly adjust the optical parameters of the coatings and induce the different absorption in visible range. The sputtering way we used is controllable, large scalable, and repeatable. The optimized configuration of coatings with three absorption layers and three anti-reflection layers demonstrated a high absorptance of 0.935 and low emittance of 0.056 at 82° C.

Besides the solar hot water system application, the selective surfaces can also be used as heat collector for the flat-panel thermoelectric generators. The spectral selective coatings can be adjusted through adding more layers, changing the thickness of each layer and altering the ratio of reactive gas. The reflectance spectra of selective surfaces obtained from FT-IR system were used to evaluate the solar selectivity through integrating with standard AM 1.5 spectrum and blackbody spectral radiation. The optimized film configuration comprising of three Cr—CrNO absorption layers and three SiNO antireflection layers have a high absorptance of 0.935 and emittance of 0.056, which may be resulted from the intrinsic properties of gradient Cr—CrNO absorption layers and SiNO anti-reflection layers, and the interference among different layers.

Exemplary embodiments of the invention are disclosed herein and variations, combinations, and/or modifications of such embodiment(s) may be made by a person having ordinary skill in the art and are within the scope of the disclosure. Alternative embodiments that result from combining, integrating, and/or omitting features of the expressly-disclosed embodiment(s) are also within the scope of the disclosure. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent . . . 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises", "includes", and "having" means "including but not limited to" and should be understood to also provide support for narrower terms such as "consisting of", "consisting essentially of", and "comprised substantially of." Accordingly, the scope of protection is not limited by the description set out above but is defined by the claims that follow, that scope including all equivalents of the subject matter of the claims. Each and every claim set out below is incorporated into this specification as additional disclosure, and each is an exemplary embodiment of the present invention. The discussion of a reference in the disclosure is not an admission that it is prior art, especially any reference that has a publication date after the priority date of this application. All patents, patent applications, and publications cited in this disclosure are hereby incorporated by reference, to the extent that they provide exemplary, procedural or other details supplementary to the disclosure.

What is claimed is:

1. A solar-selective coating comprising:
   a substrate;
   at least one cermet layer comprising chromium (Cr) nanoparticles in chromium nitric oxide (CrNO) therein deposited on the substrate; and
   at least one anti-reflection layer deposited on the at least one cermet layer, wherein the at least one anti-reflection layer comprises nitrogen (N), oxygen (O), and at least one component selected from the group consisting of boron (B), silicon (Si), germanium (Ge), arsenic (As), selenium (Se), antimony (Sb), and tellurium (Te), wherein the coating comprises a solar absorptance ($\alpha$) of at least about 0.75 in a wavelength range of about 0.3 µm to about 2.5 µm.

2. The coating of claim 1, further comprising a buffer layer disposed between the substrate layer and the at least one cermet layer.

3. The coating of claim 1, wherein the at least one cermet layer comprises a gradient of at least one property.

4. The coating of claim 3, further comprising a plurality of cermet layers.

5. The coating of claim 4, wherein each of the plurality of cermet layers has a ratio of the metal to ceramic atoms that is lower than the previous cermet layer.

6. The coating of claim 1, wherein the at least one anti-reflection layer comprises a gradient of at least one property.

7. The coating of claim 6, further comprising a plurality of anti-reflection layers.

8. The coating of claim 7, wherein each of the plurality of anti-reflection layers has a lower density or a lower ratio of semi-metallic or metallic elements to nitric oxide than the previous anti-reflective layer.

9. The coating of claim 1 comprising a thermal emittance of less than about 0.25 at about 82° C.

10. The coating of claim 1, wherein the at least one cermet layer is less than 150 nm thick.

11. A method for constructing a solar-selective coating comprising:
    depositing at least one cermet layer comprising chromium (Cr) nanoparticles in chromium nitric oxide (CrNO) on a substrate; and
    depositing at least one anti-reflection layer on the cermet layer, wherein the at least one anti-reflection layer comprises nitrogen (N), oxygen (O), and at least one component selected from the group consisting of boron (B), silicon (Si), germanium (Ge), arsenic (As), selenium (Se), antimony (Sb), and tellurium (Te) to form the solar-selective coating, wherein the solar-selective coating comprises a solar absorptance ($\alpha$) of at least about 0.75 in a wavelength range of about 0.3 µm to about 2.5 µm.

12. The method of claim 11, further comprising preparing the substrate prior to depositing the at least one cermet layer, wherein preparing a substrate comprises:
    cleaning at least one surface of the substrate; and
    depositing a buffer layer on the cleaned surface.

13. The method of claim 11, wherein depositing the at least one cermet layer on the substrate comprises depositing a cermet gradient on the substrate.

14. The method of claim 13, wherein depositing the cermet gradient comprises depositing a plurality of cermet layers.

15. The method of claim 14, wherein depositing the cermet gradient comprises controlling a ratio of metal atoms to ceramic atoms in each cermet layer of the plurality of cermet layers to form a gradient.

16. The method of claim 11 wherein depositing at least one anti-reflection layer on the substrate comprises depositing a plurality of anti-reflection layers to form a gradient.

17. The method of claim 16, wherein depositing the at least one anti-reflection layer comprises controlling a ratio of inert gases during the deposition of each anti-reflection layer of the plurality of anti-reflection layers.

18. A solar-selective coating comprising:
    a conductive substrate;
    a buffer layer deposited on the conductive substrate via chemical vapor deposition (CVD);
    a cermet layer comprising chromium (Cr) nanoparticles in chromium nitric oxide (CrNO) deposited on the buffer layer, wherein the cermet layer further comprises a gradient in a ratio of metal to ceramic; and
    at least one anti-reflection layer deposited on the cermet layer, wherein the at least one anti-reflection layer comprises nitrogen (N), oxygen (O), and at least one component selected from the group consisting of boron (B), silicon (Si), germanium (Ge), arsenic (As), selenium (Se), antimony (Sb), and tellurium (Te), wherein the solar-selective coating comprises a solar absorptance ($\alpha$) of at least about 0.75, in the wavelength range of about 0.3 µm to about 2.5 µm.

19. The coating of claim 18, wherein the at least one anti-reflection layer comprises a plurality of anti-reflection layers.

20. The coating of claim 19, wherein each of the plurality of anti-reflection layers has a lower density than the previous anti-reflective layer.

21. The coating of claim 19, wherein each of the plurality of anti-reflection layers has a lower ratio of semi-metallic or metallic elements to nitric oxide than the previous anti-reflective layer.

* * * * *